United States Patent [19]
Gademann et al.

[11] Patent Number: 5,801,330
[45] Date of Patent: Sep. 1, 1998

[54] HOUSING FOR AN ELECTRICAL DEVICE HAVING SPRING MEANS

[75] Inventors: Lothar Gademann, Rottenburg; Roland Schmid, Dettingen; Friedrich-Reinhold Hamann, Tuebingen, all of Germany

[73] Assignee: Robert Bosch GmbH, Stuttgart, Germany

[21] Appl. No.: 573,251

[22] Filed: Dec. 15, 1995

[30] Foreign Application Priority Data

Feb. 9, 1995 [DE] Germany ............ 195 04 238.7

[51] Int. Cl.⁶ ............................................. H05K 5/00
[52] U.S. Cl. ............ 174/52.1; 361/769; 361/819; 257/719
[58] Field of Search ............ 174/52.1, 52.3, 174/52.5; 200/302.1; 361/717, 718, 719, 720, 752, 769, 787, 819, 704, 707, 710; 257/719, 727, 707, 713, 718

[56] References Cited

U.S. PATENT DOCUMENTS

| | | | |
|---|---|---|---|
| 3,670,092 | 6/1972 | Updyke et al. | 174/52.3 |
| 3,721,791 | 3/1973 | Grieves et al. | 200/168 |
| 4,752,658 | 6/1988 | Mack | 200/82 |
| 4,769,744 | 9/1988 | Neugebauer et al. | 361/386 |
| 5,155,660 | 10/1992 | Yamada et al. | 361/386 |

*Primary Examiner*—Kristine L. Kincaid
*Assistant Examiner*—Hung V. Ngo
*Attorney, Agent, or Firm*—Michael J. Striker

[57] ABSTRACT

An electrical device has at least one electrical power component, a housing including a plurality of housing parts, and a spring element arranged to provide a mechanical and thermal contact of the at least one electrical power component with the housing. The housing parts including a lower housing part which is formed as a metal cover moveable within a predetermined range and the spring element presses the at least one power component in an interior of the housing against the metal cover.

6 Claims, 1 Drawing Sheet

HOUSING FOR AN ELECTRICAL DEVICE HAVING SPRING MEANS

BACKGROUND OF THE INVENTION

The present invention relates generally to an electrical device.

More particularly, it relates to an electrical device formed as an electronic controlling or regulating device, for an electromechanical arrangement. An electrical device of this general type is disclosed for example in the German document DE-OS 42 22 838. In this document power components for control device electronic circuit which produce lost heat are arranged on a printed board in a housing. In order to withdraw the lost heat of the power component, the power component is arranged on a heat conductive layer which is fixedly mounted on the printed board. The heat conductive layer has contact partially with the housing, so that the housing of its parts can be considered as a cooling element. However, this reference discloses only a fixed contacting of strip conductors of a printed board with a housing. Therefore complicated problems exist in complex arrangements and high lost powers to be withdrawn.

SUMMARY OF THE INVENTION

Accordingly, it is an object of the present invention to provide an electrical device of the above mentioned general type, which avoids the disadvantages of the prior art.

In keeping with these objects and with others which will become apparent hereinafter, one feature of the present invention resides, briefly stated, in an electrical device, in particular a control or regulating device for an electromechanical arrangement, having at least one electric power component, and heat withdrawing housing parts which are in a mechanical and thermal contact with at least one power component through a spring means, wherein in accordance with the present invention the housing of the electrical device is provided with a metal cover which is formed as a lower housing part and moveable within a predetermined range, and at least one power component is pressed against the cover by the spring means in the interior of the housing for producing a thermal contact.

The electrical device designed in accordance with the present invention is especially advantageous since due to a direct withdrawal of the lost heat through the spring means, a good mechanical and thermal contacting is guaranteed. In a very complex assembled electrical control device, it is advantageous to withdraw often relatively great lost heat directly from the rear side of the power component, with small heat resistance with a maximum possible surface, through the housing of the electrical device to an external heat sink. In particular, semiconductor relays are built in as replacement for a mechanical relay in such control device for electro-mechanical applications, special measures are required for heat withdrawal in view of the relatively high mounting density.

In accordance with another feature of the present invention, an elastic seal is provided between the movable cover and the other housing parts. As a result the required pressing force between the corresponding power component and the heat conductive housing part can be realized with the utilization of the action of the spring means in a simple manner. Also, eventual manufacturing tolerances can be compensated.

The electrical device in accordance with the present invention can be especially advantageous as a control device for a hydro-aggregate for example an antilock-brake system for a motor vehicle. In this case the housing of the electrical device can be screwed on the hydro-aggregate with its side which carries the movable cover substantially projecting outwardly of the housing. Therefore during the mounting the pressing force is provided by pressing-in of the cover.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
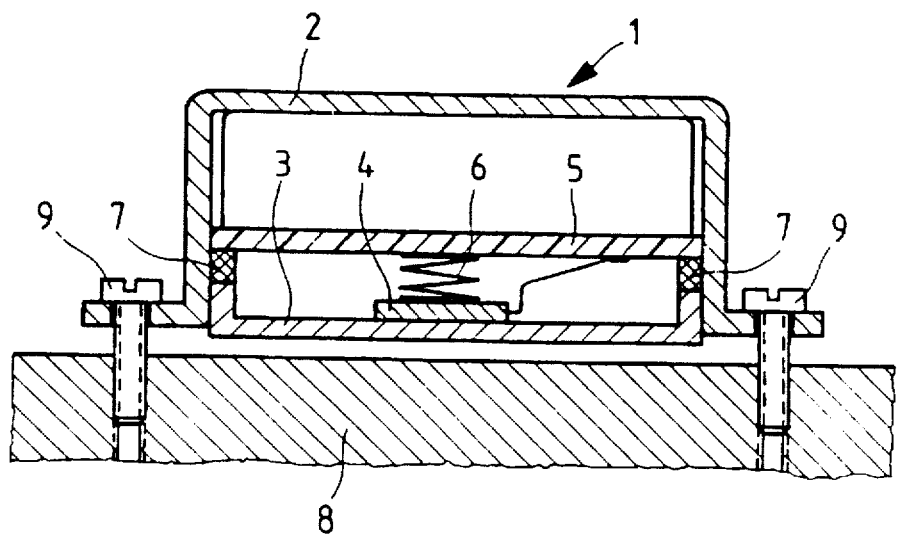
FIG. 1 shows a section of an electrical device provided with a housing and a semiconductor relay as a power component.

An electrical device in accordance with the present invention as shown in FIG. 1 has a housing which is identified as a whole with reference numeral 1. The housing 1 has an upper housing part 2 and a moveable, metal lower housing part 3 formed as a cover. A power component is identified with reference numeral 4. There can be several power components while the drawing shows only one component 4 placed with its lower side on the lower housing part 3. The power component 4 is electrically connected with a base plate 5 which is a part of a not shown electronic circuit arrangement in the interior of the structure.

The power component 4 is pressed by a spring means 6 away from the base plate 5 and against the lower housing part 3. An elastic seal 7 is arranged in a recess of the upper housing part 2. The seal 7 completely seals the housing 1 after the mounting on the one hand, and provides a movement of the lower housing part 3 during attaching of the device 1 on a hydro-aggregate. Therefore the component 4 is pressed to the spring means 6 and the fixedly located base plate 5 against the lower housing part 3.

In the shown embodiment, the housing 1 accommodates a control electronic circuit for an antilock-brake system of a personal motor vehicle. The housing 1 is mounted directly on a corresponding contact surface 8 of a hydro-aggregate formed as a mechanical brake system, by screws 9. Such a control electronic circuit of modern type can be realized in a cost-favorable manner and with improved properties when instead of conventional mechanic relays, semiconductor relays are utilized. However, for withdrawing the lost power which is unavoidably produced by the semiconductor relay, which leads to an unfavorable heating of the electrical device, corresponding arrangements must be provided. The lost heat can be withdrawn in a simple manner to the mostly metallic hydro-aggregate which because of its relatively great volume represents a substantial heat sink.

In the inventive embodiment of the electrical device, during a prefabrication stage the lower moveable housing part 3 is first loosely inserted into a recess of the lower housing part 2. The lower housing part 3 extends outwardly beyond the mounting surface of the device 1 by a predetermined distance. Then the whole arrangement is screwed on the hydro-aggregate. During the mounting, the upper housing part 3 is pressed into the housing 1 through the elastic seal 7 and thereby the required spring pressure of the spring means 6 on the power component 4 is produced.

It will be understood that each of the elements described above, or two or more together, may also find a useful application in other types of constructions differing from the types described above.

While the invention has been illustrated and described as embodied in an electrical device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An electrical device, comprising at least one electrical power component; a housing including a plurality of heat withdrawing housing parts; and spring means arranged to provide a mechanical and thermal contact of said at least one electrical power component with said housing, said housing parts including a lower housing part which is formed as a metal cover moveable within a predetermined range, said spring means pressing said at least one power component in an interior of said housing against said metal cover for producing a thermal contact.

2. An electrical device as defined in claim 1, wherein said housing has a recess; and further comprising an elastic seal, said lower housing part being insertable in said recess of said housing through said elastic seal.

3. An electrical device as defined in claim 1, wherein said lower housing part in a premounted condition extends over a lower mounting surface of said housing by a predetermined distance.

4. An electrical device as defined in claim 2; and further comprising a base plate located in said housing, said at least one power component lying directly on said lower housing part and being electrically connected with said base plate, said spring means being arranged between said at least one power component and said base plate so that during insertion of said lower housing part by said elastic seal the mechanical and thermal contact of said power component with said lower housing part is produced.

5. An electrical device as defined in claim 1; and further comprising mounting means for mounting the electrical device on an electromechanical arrangement, said mounting means being formed so that during mounting of said housing on a contact surface of the arrangement, said lower housing part is pressed by said mounting means into an upper housing part in a recess of said housing.

6. An electrical device as defined in claim 1, wherein said housing accommodates control means for an antilock-brake system of a power vehicle; and further comprising means for mounting said housing on a contact surface of a mechanical brake device.

* * * * *